| (12) | United States Patent | (10) Patent No.: | US 8,298,880 B2 |
|---|---|---|---|
| | Sato | (45) Date of Patent: | Oct. 30, 2012 |

(54) METHOD FOR MANUFACTURING COATING FILM WITH COATING LIQUID

(75) Inventor: Hiroshi Sato, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 369 days.

(21) Appl. No.: 12/676,256

(22) PCT Filed: Sep. 3, 2008

(86) PCT No.: PCT/JP2008/065882
§ 371 (c)(1),
(2), (4) Date: Mar. 3, 2010

(87) PCT Pub. No.: WO2009/031583
PCT Pub. Date: Mar. 12, 2009

(65) Prior Publication Data
US 2010/0171110 A1 Jul. 8, 2010

(30) Foreign Application Priority Data
Sep. 4, 2007 (JP) ................. 2007-229354

(51) Int. Cl.
*H01L 23/58* (2006.01)

(52) U.S. Cl. ......... 438/151; 257/E51.003; 257/E51.007; 257/40; 438/78

(58) Field of Classification Search ............... 257/642, 257/E51.003, E51.005–E51.007; 438/151, 438/780
See application file for complete search history.

(56) References Cited

U.S. PATENT DOCUMENTS

| 6,514,801 B1 | 2/2003 | Yudasaka et al. |
|---|---|---|
| 2007/0215902 A1 | 9/2007 | Nakagawa |

FOREIGN PATENT DOCUMENTS

| CN | 1950933 A | 4/2007 |
|---|---|---|
| EP | 1737027 A1 | 12/2006 |
| JP | 2-220475 A | 9/1990 |
| JP | 2005-123497 A | 5/2005 |
| JP | 2005-243822 A | 9/2005 |
| JP | 2007-13091 A | 1/2007 |
| KR | 10-2003-0008904 A | 1/2003 |
| WO | 2000-059040 A | 10/2000 |
| WO | 2006/019133 A1 | 2/2006 |

OTHER PUBLICATIONS

Ashizawa et al. Polymer FET with a conducting channel. Published in Synthetic Metals. 2005.*

(Continued)

*Primary Examiner* — Lex Malsawma
*Assistant Examiner* — Allen Parker
(74) *Attorney, Agent, or Firm* — Abelman, Frayne & Schwab

(57) ABSTRACT

Method for manufacturing a semiconductor device, which may include (a) forming a coating film on a substrate by applying a coating liquid including a polymer conductive material dissolved in an insulating solvent on the substrate after the step (a); (b) heat-treating the coating film; and (c) forming, before or after the steps (a) and (b), a gate electrode on the substrate. Herein, a surface layer portion is an insulating layer, and an inner layer portion is an organic semiconductor layer, and the surface layer portion and the inner layer portion are formed separate from each other to allow the surface layer portion and the inner layer portion to be used as a gate insulating film and a channel of a field-effect transistor, respectively.

6 Claims, 11 Drawing Sheets

OTHER PUBLICATIONS

English Langauge Abstract provided by Derwent for JP-2007013091 (original copy previously provided with the IDS of Mar. 3, 2010).*

International Search Report for International Application No. PCT/JP2008/065882 mailed Oct. 21, 2008 with English Translation.

An Office Action dated Jun. 1, 2011, issued from the Korean Intellectual Property Office (KIPO) of Korean Patent Application No. 10-2010-7003036, and an English translation thereof.

* cited by examiner

A

METHOD FOR MANUFACTURING COATING FILM WITH COATING LIQUID

This is a U.S. national stage application of International Application No. PCT/JP2008/065882, filed on 3 Sep. 2008. Priority under 35 U.S.C. §119(a) and 35 U.S.C. §365(b) is claimed from Japanese Application No. 2007-229354, filed 4 Sep. 2007, the disclosure of which is also incorporated herein by reference.

TECHNICAL FIELD

The present invention relates to a method for manufacturing a semiconductor device, and more particularly to a method for manufacturing a gate structure of a transistor.

BACKGROUND

As a transistor for a semiconductor device, a silicon transistor is mainly used. However, for the manufacturing process of the silicon transistor, a large-scale facility, such as a clean room, is required. Also, complicated processes, including doping of p-type (or n-type) impurities into a silicon substrate, and photolithography, are required.

Accordingly, the development of an organic transistor using an organic-based semiconductor layer has been recently considered. In the fabrication process of an organic transistor, since a thin film layer can be formed by a coating film, a printing process, such as inkjet, may be used. Thus, the fabrication process of the organic transistor may be simple, and thus reduce a manufacturing cost, compared to that of a silicon transistor. Also, there is another advantage in that a flexible plastic substrate may be used as a substrate. Meanwhile, the organic transistor has a problem in that carrier mobility of organic molecules is lower than that of silicon single crystals. However, research on this problem is smoothly being conducted through the development of materials.

For example, Japanese Patent Laid-Open Publication No. 2006-302925 (especially, claims 1 and 5, paragraph 0050, FIG. 5) discloses a fabrication method of an organic transistor, in which a PEDOT/PSS gate electrode film is formed on a substrate, a polyvinylphenol gate insulating film is formed on the gate electrode film, a PEDOT organic semiconductor material film is formed on the gate insulating film, and a PEDOT/PSS source electrode film and a drain electrode film are formed on the organic semiconductor material film.

However, in order to insulate an organic semiconductor material film and a gate electrode film, after the formation of the gate electrode film, a gate insulating film forming process through a spin coating method is required. Thus, it was difficult to sufficiently simplify fabrication processes.

SUMMARY OF THE INVENTION

Accordingly, the present invention has been made to solve the above-mentioned problems occurring in the prior art, and the present invention is to provide a semiconductor device manufacturing method with simplified processes, and particularly a method for manufacturing a transistor using an organic-based material.

In accordance with an aspect of the present invention, there is provided a method for manufacturing a semiconductor device, which includes the steps of: (a) forming a coating film on a substrate by applying a coating liquid including a polymer conductive material dissolved in an insulating solvent on the substrate; (b) heat-treating the coating film after the step (a); and (c) forming, before or after the steps (a) and (b), a gate electrode on the substrate. Herein, a surface layer portion is an insulating layer, and an inner layer portion is an organic semiconductor layer, and the surface layer portion and the inner layer portion are formed separate from each other to allow the surface layer portion and the inner layer portion to be used as a gate insulating film and a channel of a field-effect transistor, respectively.

According to the present invention, in manufacturing a field-effect transistor, since a surface layer portion which is an insulating layer, and an inner layer portion which is an organic semiconductor layer are formed separate from each other, the surface layer portion and the inner layer portion may be used as a gate insulating layer and a channel of a field-effect transistor, respectively. Thus, there is no need to independently perform a film-forming process of a gate insulating film before or after the formation of a gate electrode. This simplifies the manufacturing process of the transistor. As a result, it is possible to significantly reduce the manufacturing cost of a semiconductor device (transistor).

Herein, the method may preferably include, after the step (b), the steps of: forming concave portions by etching sites corresponding to both sides of the gate electrode of the coating film, and burying a source electrode and a drain electrode in each of the concave portions.

Also, the polymer conductive material may be polythiophene, and the insulating solvent may be poly(styrenesulfonic acid).

Also, in accordance with another aspect of the present invention, there is provided a semiconductor device manufactured by the above described manufacturing method.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE EXEMPLARY EMBODIMENTS

Figure 1:
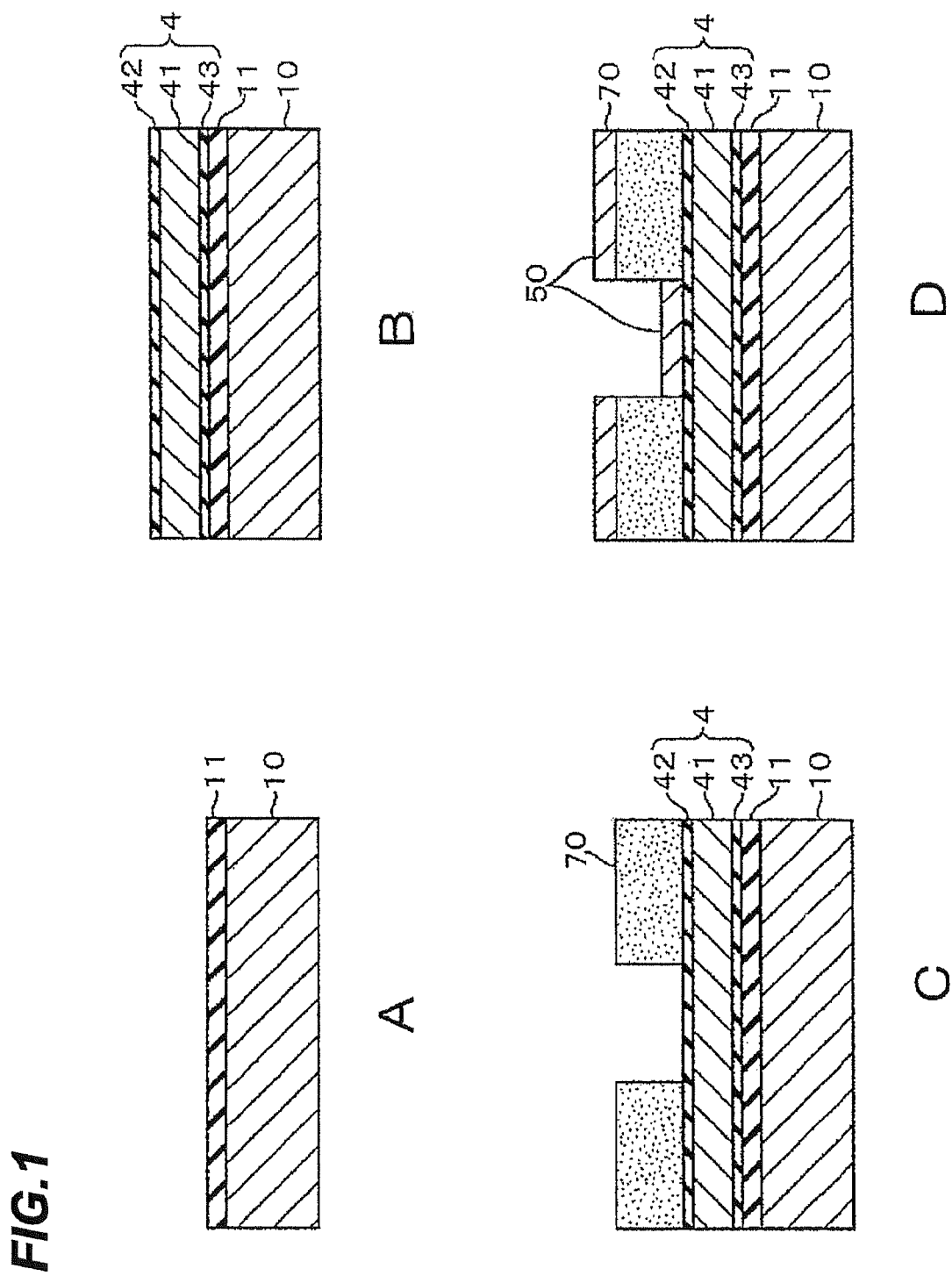
FIGS. 1A to 1D schematically show cross-sectional views of a substrate to illustrate fabrication processes of a field-effect transistor according to a first embodiment of the present invention.
Figure 2:
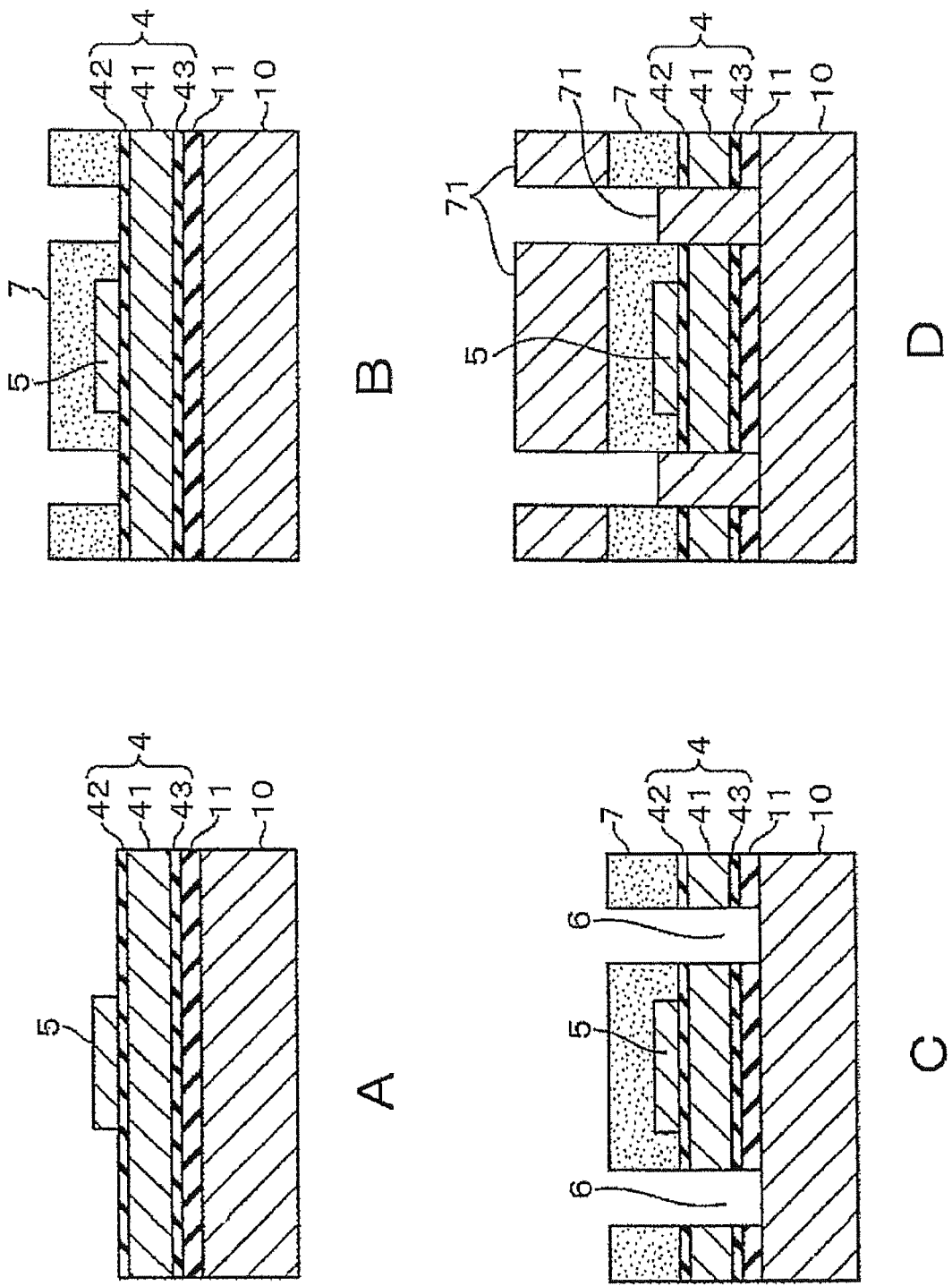
FIGS. 2A to 2D schematically show cross-sectional views of the substrate to illustrate fabrication processes of the field-effect transistor according to a first embodiment of the present invention, following FIG. 1D.
Figure 3:
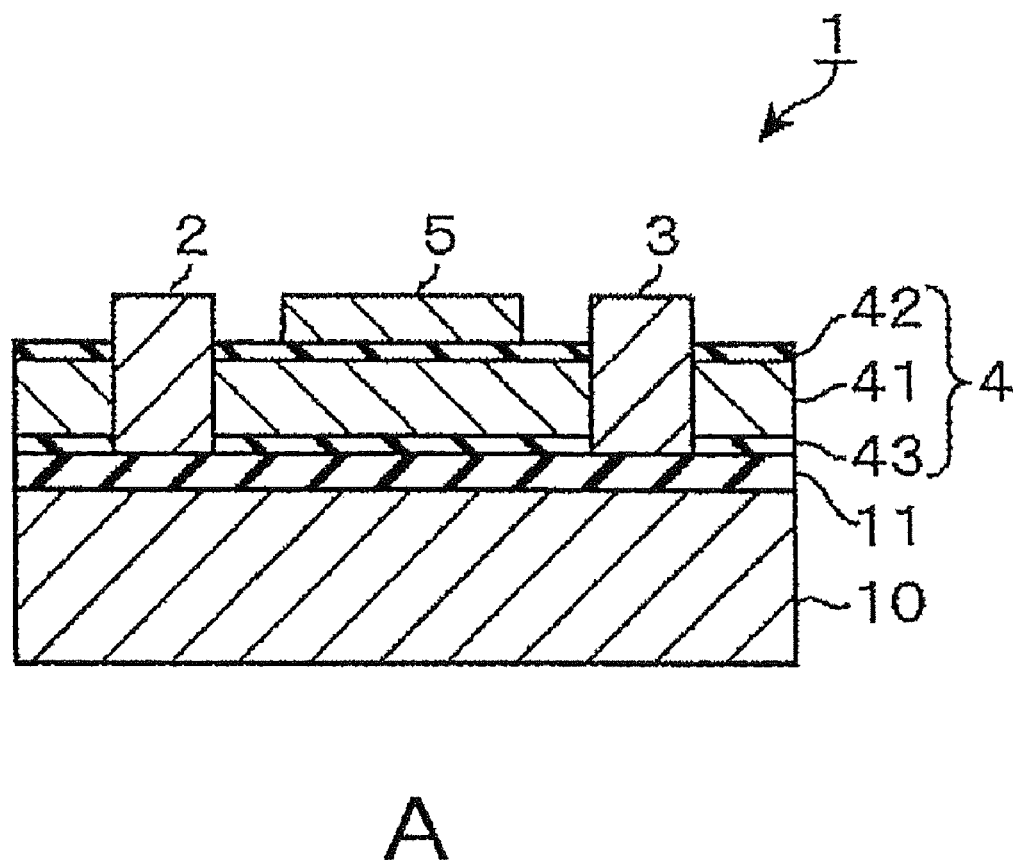
FIG. 3A schematically shows a cross-sectional view of the substrate to illustrate fabrication processes of the field-effect transistor according to a first embodiment of the present invention, following FIG. 2D.

Hereinafter, an exemplary embodiment of the present invention will be described with reference to the accompanying drawings. In the following description and drawings, the same reference numerals are used to designate the same or similar components, and so repetition of the description on the same or similar components will be omitted.

[First Embodiment]

Hereinafter, a manufacturing process of a field-effect transistor 1 with top-gate structure, as a manufacturing method of a semiconductor device according to the first embodiment of the present invention, will be described with reference to FIGS. 1A to 3A.

First, for example, on a plastic substrate 10, an insulating film 11 including a silicon oxide film ($SiO_2$) is formed by a spin coating method (FIG. 1A). Then, on the surface of the insulating film 11, a coating liquid including PEDOT(poly(3,4-(ethylenedioxy)thiophene) as a polymer conductive material, and PSS(poly(styrenesulfonic acid)) as an insulating solvent at a concentration ratio of 1:10 is applied to form a coating film 4. For example, the thickness of the coating film 4 may be 9 nm.

Then, as will be described later in the embodiment, the inner layer portion of the coating film 4 includes polythiophene (a polymer conductive material) in a large amount, and thus is configured as an organic semiconductor layer 41, while the surface layer portions of the coating film 4 include polythiophene in a much smaller amount than the inner layer portion, and thus are configured as insulating layers 42 and 43. In other words, the coating film 4 is separated into two kinds of layers, including the insulating layers 42, and 43 and the organic semiconductor layer 41. The film thickness of the insulating layers 42, and 43 may be, for example, 2 nm, and the film thickness of the organic semiconductor layer 41 may be, for example, 5 nm. Once the coating liquid is applied to the substrate 10, the coating film 4 is separated into the surface layer portion as an insulating layer and the inner layer portion as an organic semiconductor layer.

Also, although the concentration ratio of PEDOT to PSS is 1:10 in the above description, the present invention is not limited thereto. The concentration ratio of PEDOT to PSS may be variable as long as, as described above, the coating liquid applied to the substrate 10 is separated into two kinds of layers, including the insulating layers 42, and 43 and the organic semiconductor layer 41, and the surface layer portions function as the insulating layers 42, and 43, and the inner layer portion functions as the organic semiconductor layer 41.

Then, the coating film 4 is dried under a nitrogen atmosphere, for example, at 100☐ or less, preferably at 80☐ (FIG. 1B). Then, on the surface of the coating film 4, a predetermined shape-patterned resist film 70 is formed (FIG. 1C). Next, on the surface of the coating film 4 layered with the resist film 70, an electrode layer 50 including copper is formed by sputtering (FIG. 1D). Then, the resist film 70 is dissolved, and thus the electrode layer 50 on the resist film 70 is removed, thereby forming a gate electrode 5 (FIG. 2A). In other words, the organic semiconductor layer 41, the insulating layer 42, and the gate electrode 5 are sequentially layered.

Also, as described above, since the insulating layer 42 has a thin film thickness of 2 nm, the insulating layer 42 functions as a gate insulating film.

Next, on the surface of the coating film 4, a predetermined shape-patterned resist film 7 is formed (FIG. 2B). Then, while the resist film 7 functions as a mask, the exposed portion of the coating film 4 is removed by dry-etching. As a result, a concave portion 6 for burying an electrode is formed up to the insulating film 11 below the coating film 4 (FIG. 2C). Next, on the surface of the substrate 10 layered with the resist film 7, an electrode layer 71 including, for example, copper is buried by sputtering, to form an electrode from the bottom of the concave portion 6 with a predetermined height (FIG. 2D). Then, the resist film 7 is dissolved, and thus the electrode layer 71 on the resist film 7 is removed, thereby forming a source electrode 2 and a drain electrode 3 (FIG. 3A). In this manner, a field-effect transistor 1 with top-gate structure is manufactured. On the substrate 10, for example, a multi-layered wiring structure or another element may be formed, to provide a required semiconductor device.

Figure 4:
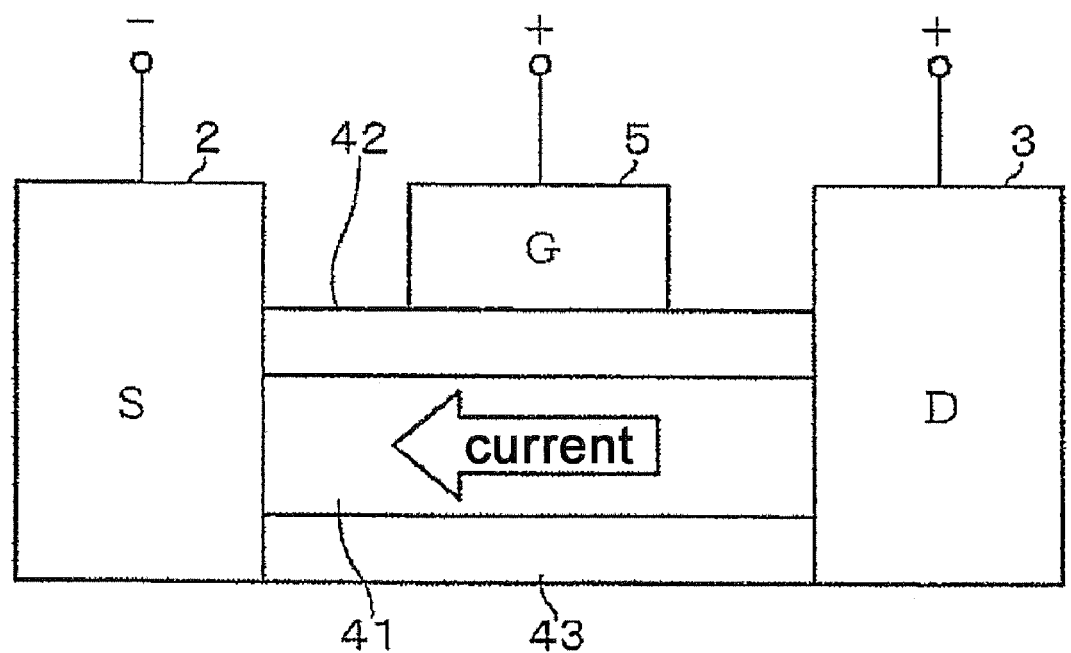
FIG. 4 is a mimetic diagram illustrating the state where a current flows in a semiconductor device in FIG. 3A.

In the above described field-effect transistor 1, when a voltage is applied between the source electrode 2 and the drain electrode 3, and between the gate electrode 5 and the source electrode 2, the organic semiconductor layer 41 of the inner layer portion becomes conductive as shown in FIG. 4. Thus, a current flows from the drain electrode 3 to the source electrode 2. In other words, the organic semiconductor layer 41 of the inner layer portion may be used as a transistor channel.

Figure 5:
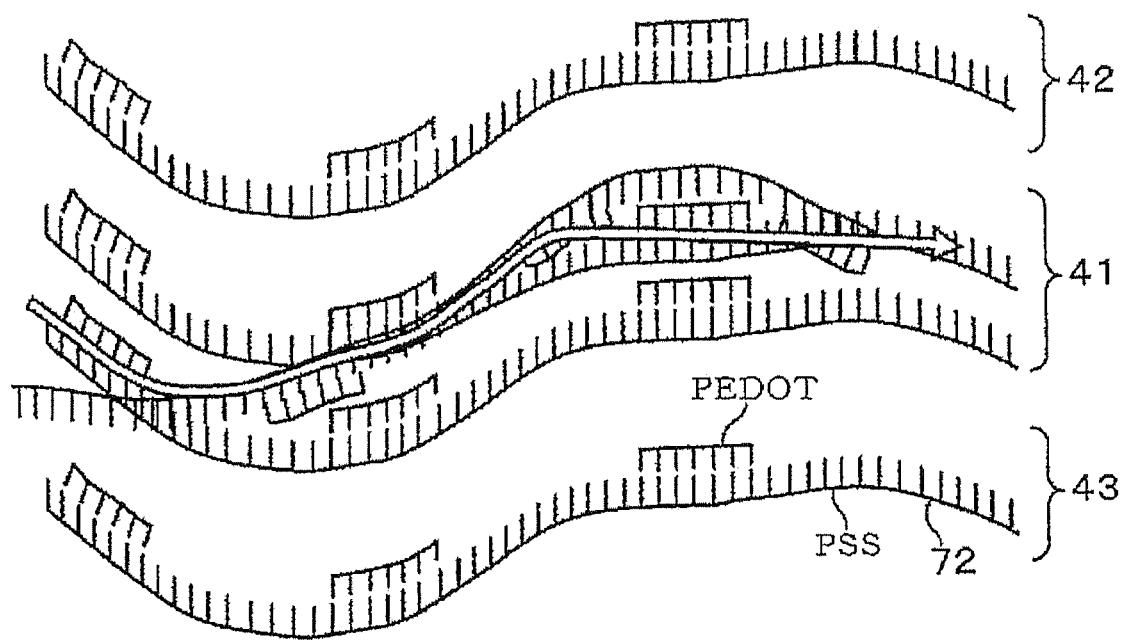
FIG. 5 is an explanatory view illustrating the current flow mechanism of a semiconductor device in FIG. 3A.
Figure 6:
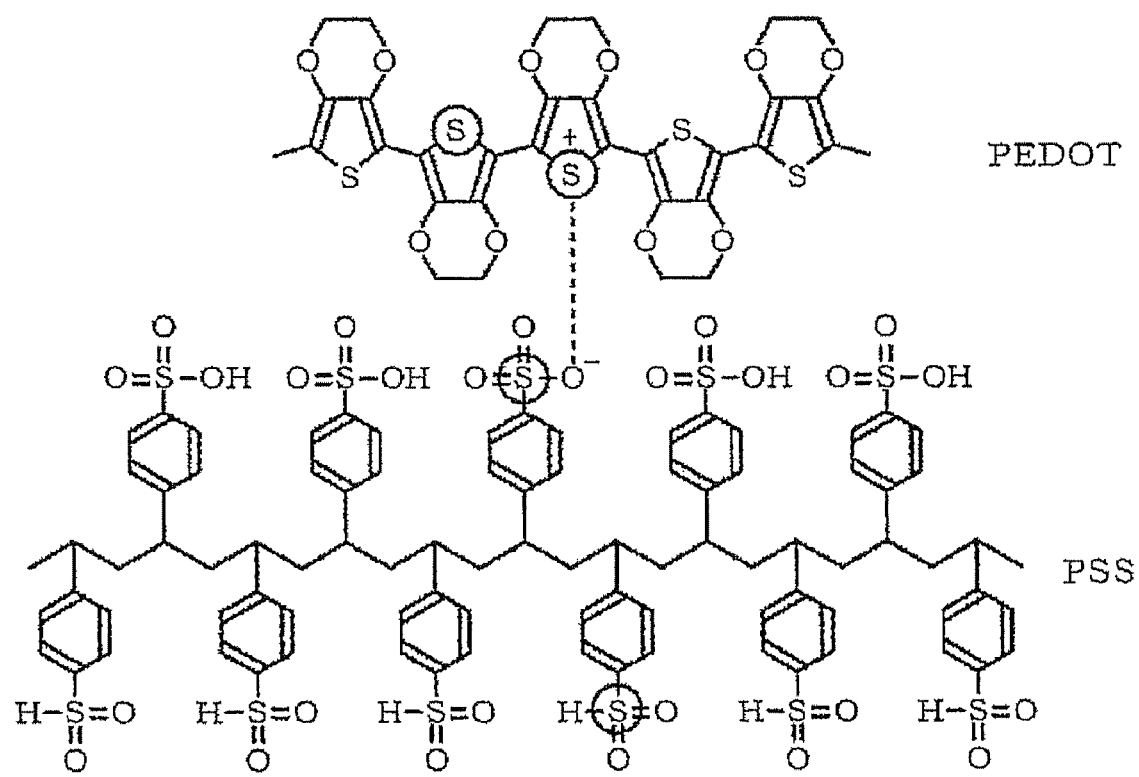
FIG. 6 is a view illustrating the molecular structure of a PSS-PEDOT copolymer.
Figure 7:
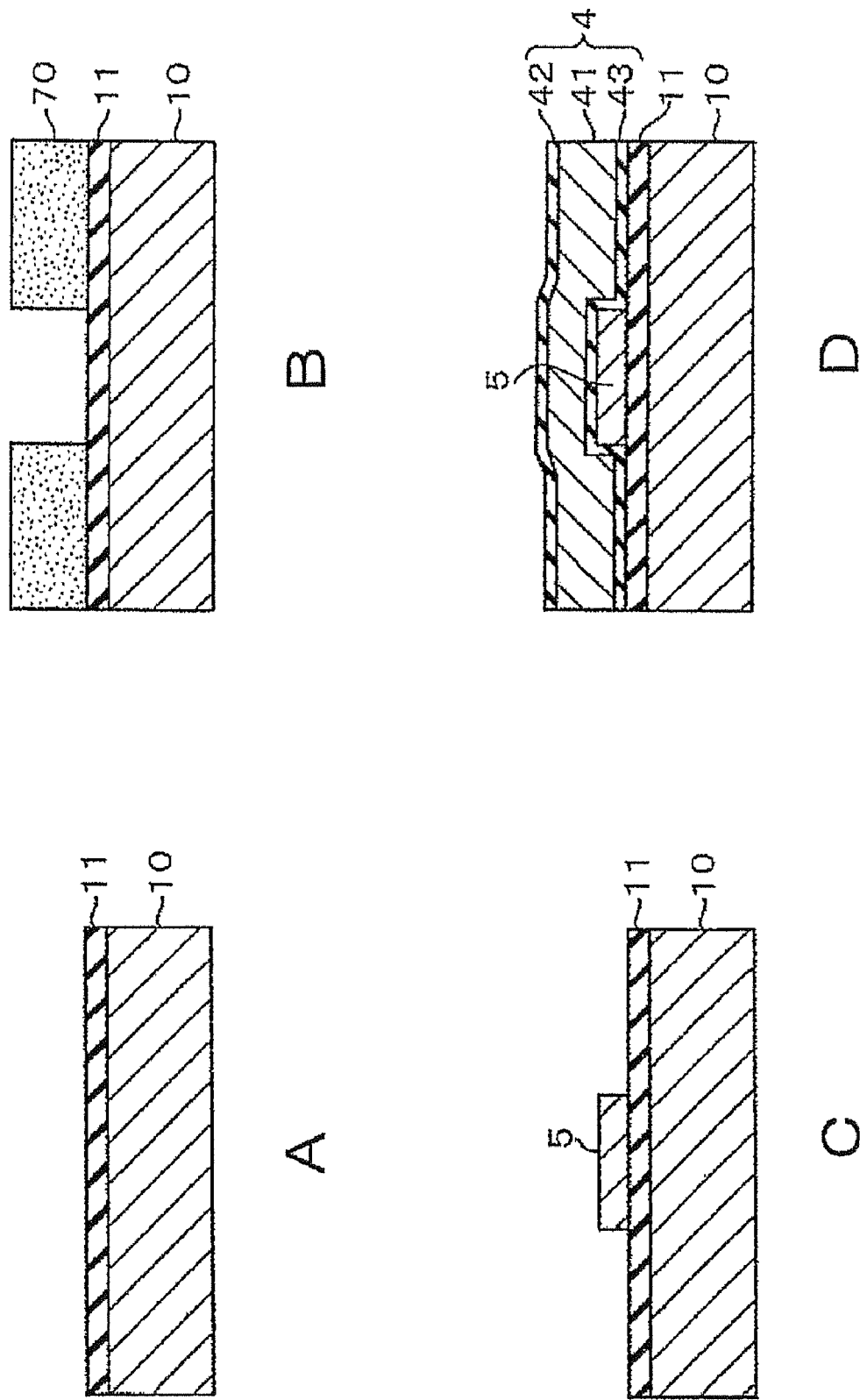
FIGS. 7A to 7D schematically show cross-sectional views of a substrate to illustrate fabrication processes of a field-effect transistor according to a second embodiment of the present invention.
Figure 8:
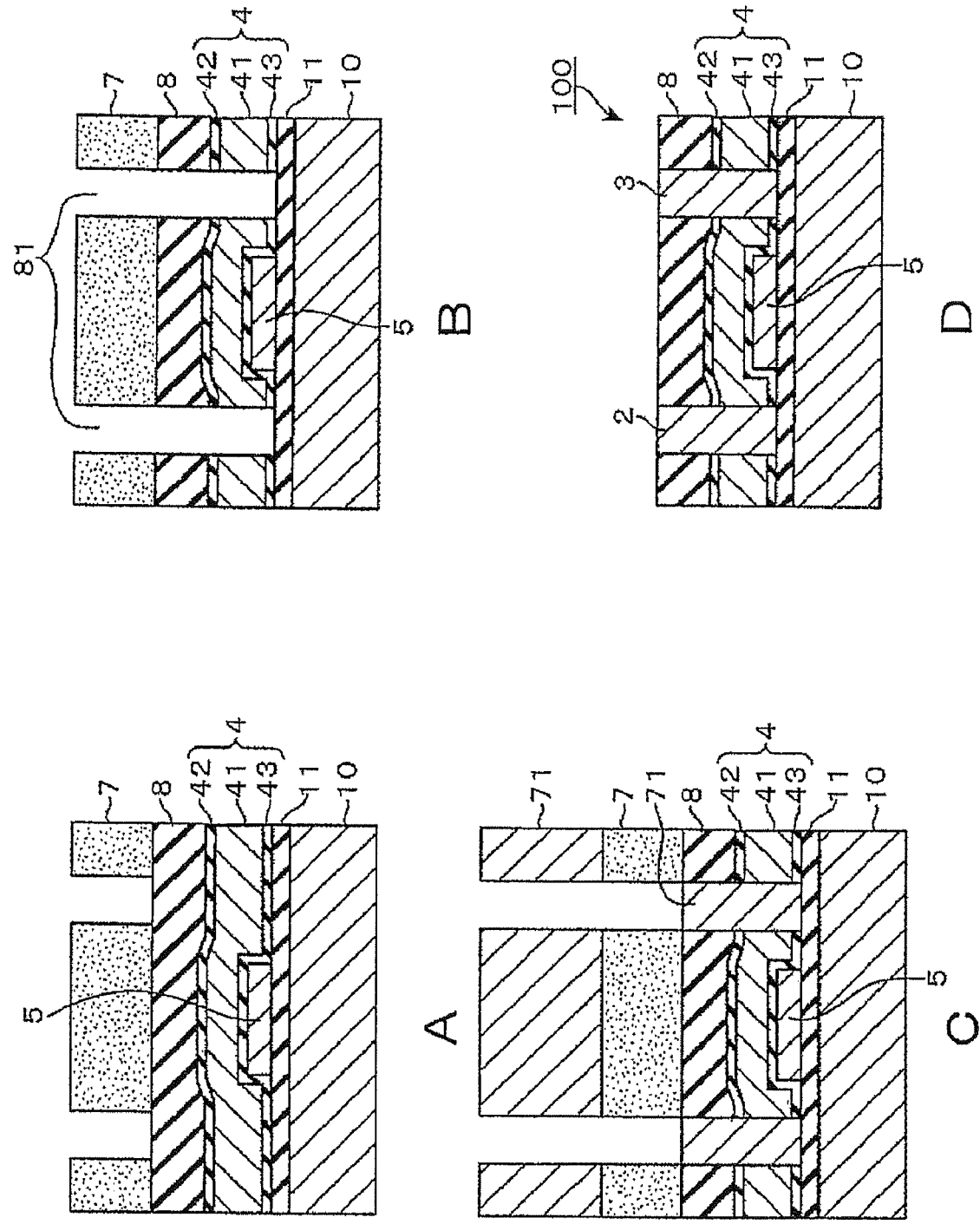
FIGS. 8A to 8D schematically show cross-sectional views of the substrate to illustrate fabrication processes of the field-effect transistor according to a second embodiment of the present invention, following FIG. 7D.

Hereinafter, the current flow mechanism in the coating film 4 will be described. FIG. 5 is a mimetic diagram of the coating film 4, in which the horizontal direction is a planar direction of the coating film 4, and the vertical direction is the film thickness direction of the coating film 4. As shown in FIG. 5, in the coating film 4, there exists a copolymer 72 of a long-strip shaped poly styrenesulfonic acid (hereinafter, referred to as PSS) added with a plurality of polythiophenes (hereinafter, referred to as PEDOT). The structural formula of the copolymer 72 is shown in FIG. 6. As shown in FIG. 6, positively charged S of PEDOT is linked to —$SO_2$—O— group of PSS, thereby forming the copolymer 72 of PSS and PEDOT. Then, when a voltage is applied to the copolymer 72, PEDOT is subjected to a change therein, and is polarized to generate protons (positively charged). Also, in the organic semiconductor layer 41, since the number of copolymers 72 is much greater than that of the insulating layers 42, and 43, multiple copolymers 72 are piled up one on another. Accordingly, in the organic semiconductor layer 41, it is assumed that charges generated in PEDOTs may freely move between the PEDOTs because the external distance between the PEDOTs is reduced. As a result, it is assumed that in the organic semiconductor layer 41, a carrier path is formed.

According to the present embodiment, in manufacturing the field-effect transistor 1, when a coating liquid is applied on the substrate 10, the surface layer portion of insulating layers 42 and 43, and the inner layer portion of the organic semiconductor layer 41 are formed separate each other. Herein, since the surface layer portion and the inner layer portion may be used as a gate insulating layer and a transistor channel, respectively, there is no need to independently perform a film-forming process of a gate insulating film before the formation of a gate electrode 5. This simplifies the manufacturing process of the transistor 1. As a result, it is possible to reduce the manufacturing cost of a semiconductor device.

[Second Embodiment]

Hereinafter, a manufacturing process of a bottom-gate structure field-effect transistor 100, as a manufacturing method of a semiconductor device according to a second embodiment of the present invention, will be described with reference to FIGS. 7A to 8D.

First, for example, on a plastic substrate 10, an insulating film 11 including a silicon oxide film ($SiO_2$) is formed by a spin coating method (FIG. 7A). Then, on the surface of the insulating film 11, a predetermined shape-patterned resist film 70 is formed (FIG. 7B). In the same manner as described with reference to FIGS. 1D and 2A, an electrode layer is formed and the resist film 70 is dissolved, thereby forming a gate electrode 5 (FIG. 7C). Next, in the same manner as described with reference to FIG. 1B, on the surface of the insulating film 11, the application of a coating liquid and the drying of a coating film 4 are carried out (FIG. 7D). Accordingly, the gate electrode 5, an insulating layer 43, and an organic semiconductor layer 41 are sequentially layered. Also, the insulating layer 43 functions as a gate insulating film.

Next, on the surface of the coating film 4, an interlayer insulating film 8 is formed, for example, by a spin-coating method. On the surface of the insulating film 8, a predetermined shape-patterned resist film 7 is formed (FIG. 8A). Then, as the resist film 7 functions as a mask, a concave portion 81 for burying an electrode is formed up to the insulating film 11 below the coating film 4 (FIG. 8B). Next, on the surface of the substrate 10 layered with the resist film 7, an electrode layer 71 including copper is buried by sputtering, to form an electrode from the bottom of the concave portion 81 with a predetermined height (FIG. 8C). Then, the resist film 7 is dissolved, and thus the electrode layer 71 on the resist film 7 is removed, thereby forming a source electrode 2 and a drain electrode 3 (FIG. 9D). In this manner, a field-effect transistor 100 with bottom-gate structure is manufactured. On the substrate 10, for example, a multi-layered wiring structure or another element may be formed, to provide a required semiconductor device.

In the above described second embodiment, there is no need to independently perform a film-forming process of a gate insulating film after the formation of a gate electrode 5. This simplifies the manufacturing process of the transistor 100. As a result, it is possible to reduce the manufacturing cost of a semiconductor device.

Also, although in the above described embodiments, PEDOT is used as a conductive material, the present invention is not limited thereto. For example, PPV[Poly-Phenylene Vinylene] may be used. Also, an insulating solvent of the present invention is not limited to PSS. For example, chloroform, dichlorobenzene, toluene, xylene, etc. may be used.

EXAMPLE

Hereinafter, an example performed to test the effects of the present invention will be described.

On the surface of a polyethylene terephthalate (PET) substrate, a coating liquid including PEDOT which is a polymer conductive material and PSS which is an insulating solvent at a concentration ratio of 1:10 was applied, thereby forming a coating film 4. The coating film 4 was dried under a nitrogen atmosphere, at 80□. Then, through X-ray Photoelectron Spectroscopy (XPS), an X-ray photoelectron spectrum of a surface layer portion with an X-ray radiation angle of 15°, and an X-ray photoelectron spectrum of an inner layer portion with an X-ray radiation angle of 45° were obtained.

Figure 9:
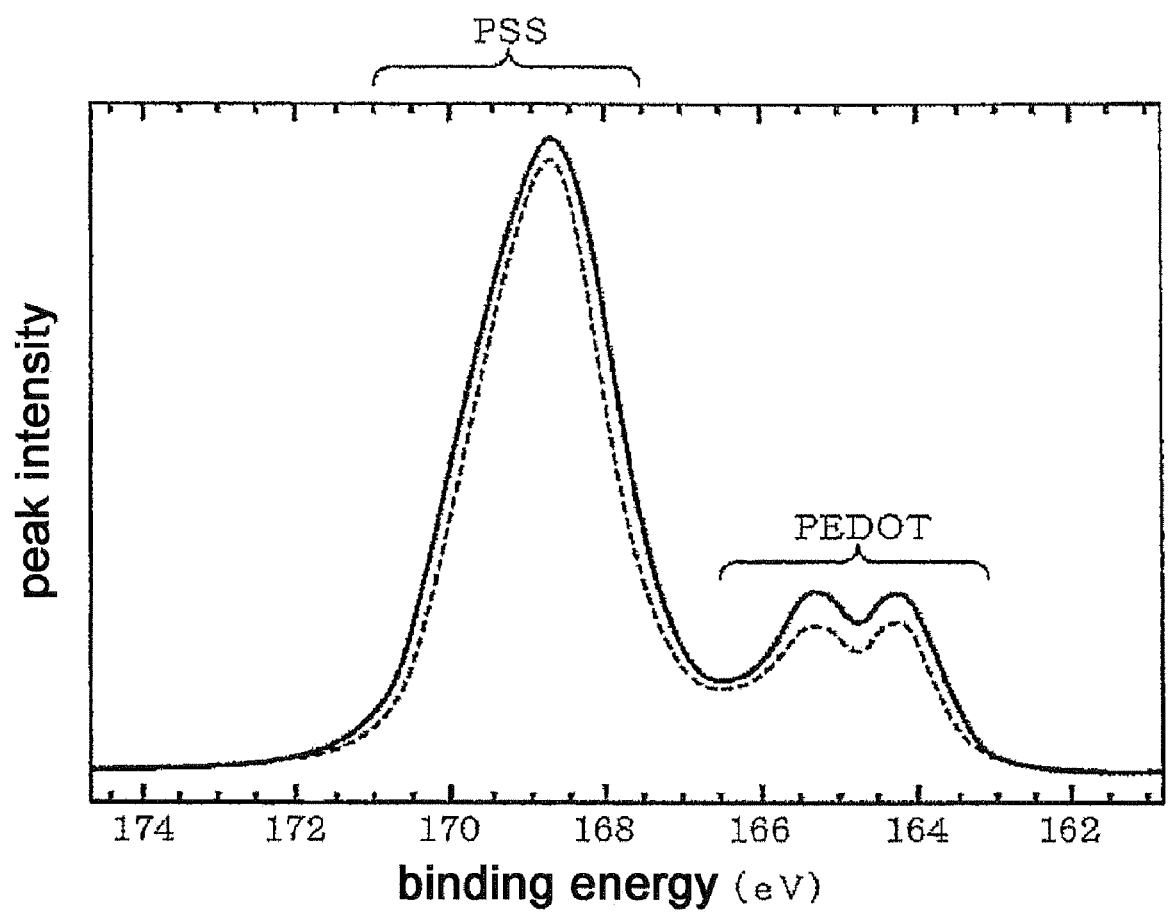
FIG. 9 is a graph showing the analysis result of X-ray photoelectron spectroscopy (XPS) on a coating film.

These results are shown in FIG. 9. The axis of ordinates in FIG. 9 indicates a peak intensity, and the axis of abscissas indicates a binding energy (eV). In FIG. 9, a solid line spectrum indicates the peaks of PEDOT and PSS in the inner layer portion, and a dotted line spectrum indicates the peaks of PEDOT and PSS in the surface layer portion. Based on the results, it was shown that while the concentration ratio of PEDOT to PSS in the surface layer portion was 0.35, the concentration ratio of PEDOT to PSS in the inner layer portion was 0.37. In other words, it was shown that the inner layer portion includes more PEDOTs than the surface layer portion. Accordingly, since compared to the inner layer portion, the surface layer portion has a lower degree of polymerization of PEDOT, and thus can function as an insulating layer.

Figure 10:
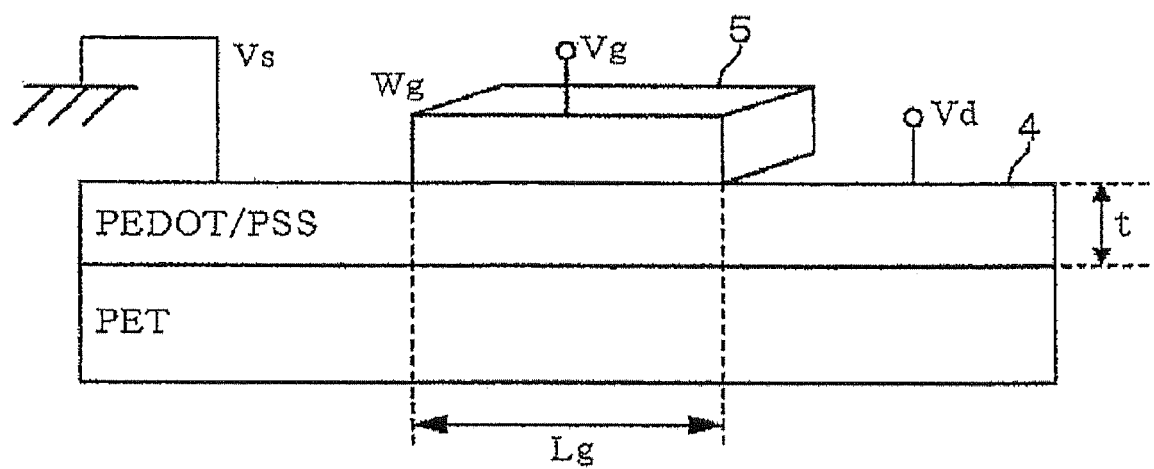
FIG. 10 is a mimetic diagram illustrating the state where a voltage is applied to a transistor.

As described above, after the formation of a coating film 4 on the surface of the PET substrate, the processes described in FIGS. 1C to 3A were carried out, thereby forming a gate electrode 5, a source electrode 2, and a drain electrode 3. As a result, a field-effect transistor 1 with top-gate structure was manufactured. Then, as shown in FIG. 10, in a state where the source electrode (Vs) was grounded, a gate electrode (Vg) was set as five values, including 0V, 1V, 2V, 3V and 5V. For each set value, an applied voltage to a drain electrode (Vd) was increased, and a drain current characteristic of the coating film 4 was measured.

Figure 11:
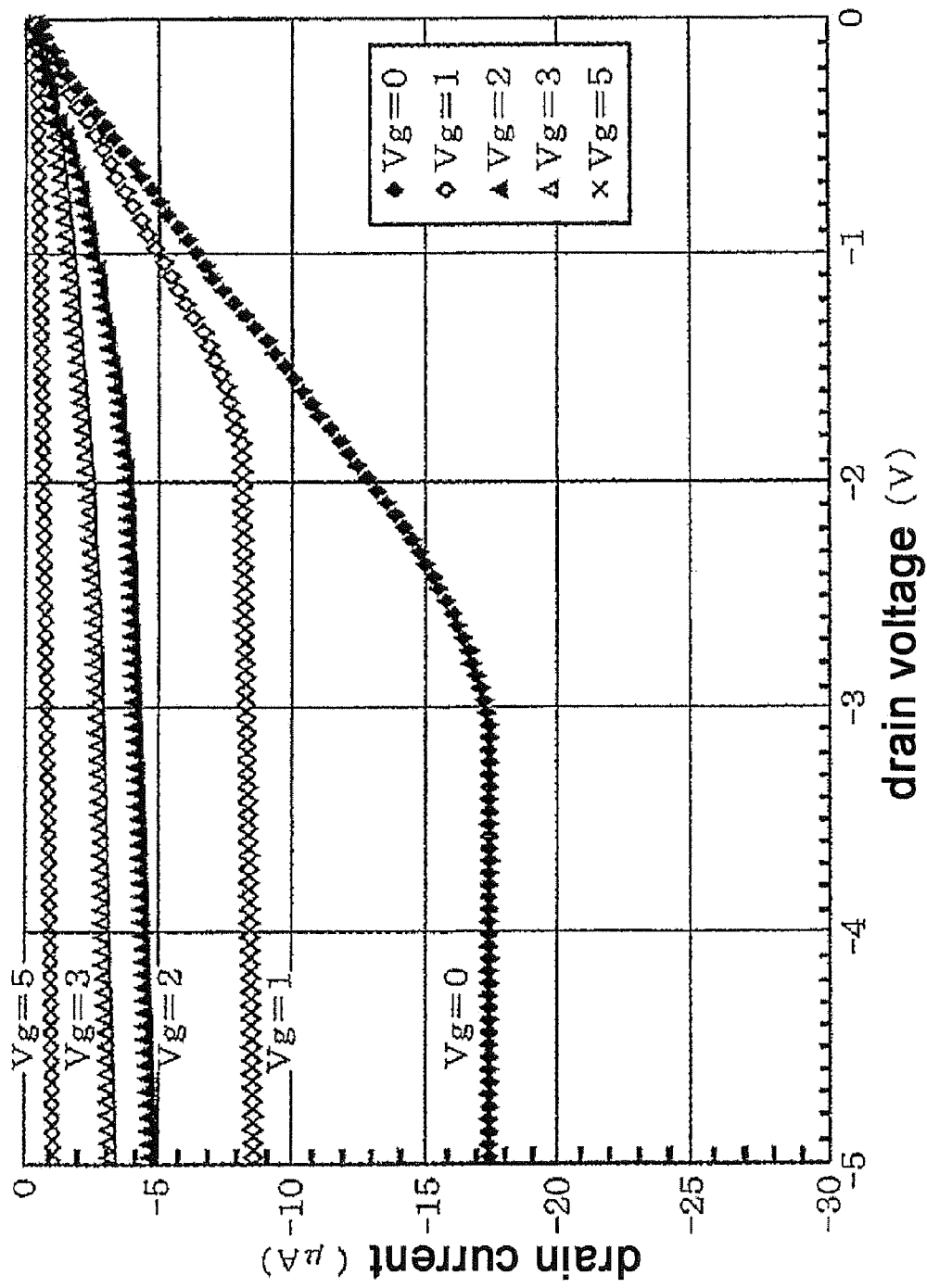
FIG. 11 is a graph illustrating a drain current characteristic in a coating film.

The results are shown in FIG. 11. In FIG. 11, the axis of ordinates indicates a drain current (μA), and the axis of abscissas indicates a drain voltage (V). From the results shown in FIG. 11, it can be understood that the inner layer portion of the coating film 4 functions as an organic semiconductor layer 41. Also, it can be understood that when a voltage applied between a source electrode and a drain electrode is more than a predetermined value, a current flows between the source electrode and the drain electrode, thereby allowing the device to function as a field-effect transistor.

Also, from the drain current characteristic shown in FIG. 11, carrier mobility in the coating film 4 was calculated. This calculation was carried out by the following Formula.

$$\mu = (2t \cdot Lg \cdot I_{dsat}) / (Wg \cdot \in_O \in_r \cdot (Vg - Vt)^2)$$

In the Formula, t represents a thickness of the coating film 4, Lg represents a length of a gate, $I_{dsat}$ represents a saturation current, Wg represents a width of a gate, $\in_O$ represents a vacuum permittivity, $\in_r$ represents a relative dielectric constant, and Vt represents a threshold voltage. From the calculation result by the Formula, it can be known that the carrier mobility (μ) in the coating film 4 changes within a range of 0.02~6.9 $cm^2$/V·sec.

Although an exemplary embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for manufacturing a semiconductor device, the method comprising the steps of:
    (a) forming a copolymer coating film on a substrate by applying a coating liquid comprising a polymer conductive material dissolved in an insulating solvent on the substrate;
    (b) heat-treating the coating film after the step (a); and
    (c) forming, before or after the steps (a) and (b), a gate electrode on the substrate,
    wherein the copolymer coating film is separated into a surface layer portion is an insulating layer, and an inner layer portion an organic semiconductor layer,
    wherein the polymer conductive material is in the surface layer portion and the inner layer portion, and wherein the surface layer portion is used as a gate insulating film and the inner layer portion is used as a channel of a field-effect transistor, wherein a concentration ratio of the polymer conductive material to the insulating solvent in the inner layer portion is larger than that of the polymer conductive material to the insulating solvent in the surface layer portion.

2. The method as claimed in claim 1, comprising, after the step (b), the steps of:

forming concave portions by etching sites corresponding to both sides of the gate electrode of the coating film; and burying a source electrode and a drain electrode in the concave portions.

3. The method as claimed in claim 1, wherein the polymer conductive material is polythiophene, and the insulating solvent is poly styrenesulfonic acid.

4. The method as claimed in claim 3, wherein the polythiophene is poly(3,4-(ethylenedioxy)thiophene.

5. A semiconductor device manufactured by the manufacturing method as claimed in claim 1.

6. The method as claimed in claim 1, wherein the copolymer coating film is formed by binding the polymer conductive material and the insulating solvent.

* * * * *